(12) United States Patent
Tittenhofer et al.

(10) Patent No.: US 11,112,572 B2
(45) Date of Patent: Sep. 7, 2021

(54) NETWORK CABINET MODULE

(71) Applicant: Cisco Technology, Inc., San Jose, CA (US)

(72) Inventors: Michael Tittenhofer, Fuerth (DE); Theodor Kupfer, Feucht (DE); Viktor Brauer, Nuremberg (DE)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/591,531

(22) Filed: Oct. 2, 2019

(65) Prior Publication Data

US 2020/0113077 A1 Apr. 9, 2020

(30) Foreign Application Priority Data

Oct. 9, 2018 (GB) .................................... 1816470

(51) Int. Cl.
*H05K 5/02* (2006.01)
*H05K 7/14* (2006.01)
(Continued)

(52) U.S. Cl.
CPC ......... *G02B 6/4269* (2013.01); *G02B 6/4261* (2013.01); *H05K 5/0256* (2013.01);
(Continued)

(58) Field of Classification Search
CPC ........... H05K 7/20127; H05K 7/20409; H05K 7/20418–20545; G02B 6/42; G02B 6/4256–4269; G02B 6/4277–4278; H01R 13/6335; H01R 13/6581; H01R 13/659; H01R 13/665; H01R 13/6658; H01R 2201/04; H01R 24/28; H01R 2107/00;
(Continued)

(56) References Cited

U.S. PATENT DOCUMENTS 10,185,109 B2 * 1/2019 Zer ..................... H04Q 11/0071
10,444,453 B1 * 10/2019 Khmaisee ............ G02B 6/4284
(Continued)

FOREIGN PATENT DOCUMENTS

KR 20130084870 A 7/2013
WO 2016105567 A1 6/2016

OTHER PUBLICATIONS

Tom Palkert, QSFP Double Density 8X Pluggable Transceiver, Sep. 2017, QSFP-DD MSA, Rev. 3.0, pp. 41, 27. (Year: 2017).*
(Continued)

*Primary Examiner* — Zachary Pape
*Assistant Examiner* — Amir A Jalali
(74) *Attorney, Agent, or Firm* — Patterson + Sheridan, LLP

(57) ABSTRACT

In one embodiment, a pluggable module for insertion into a socket of a network cabinet is disclosed, the pluggable module comprising a body having first and second portions arranged along an axis, wherein the module is arranged for insertion of the first portion into said socket in a direction of insertion along the axis, whereupon the second portion protrudes from said socket along the axis and away from the direction of insertion, and wherein the second portion comprises a first heat sink on a surface of the second portion, wherein the first heat sink comprises a plurality of parallel fins aligned with the axis of insertion.

22 Claims, 8 Drawing Sheets

(51) Int. Cl.
    *H05K 7/20*     (2006.01)
    *G02B 6/42*     (2006.01)

(52) U.S. Cl.
    CPC ......... *H05K 7/1487* (2013.01); *H05K 7/1491* (2013.01); *H05K 7/20163* (2013.01); *H05K 7/20409* (2013.01)

(58) Field of Classification Search
    CPC ......... H01R 25/006; H01R 26/64; F28F 3/06; F28F 9/001; H04B 10/40; H04B 10/50; H01L 23/34–4093; F21V 29/50
    USPC ............... 361/701–712, 818; 165/80.1–80.3; 257/722
    See application file for complete search history.

(56) References Cited

U.S. PATENT DOCUMENTS

| | | | | |
|---|---|---|---|---|
| 10,690,868 | B1* | 6/2020 | Goergen | G02B 6/4269 |
| 2013/0279122 | A1* | 10/2013 | Tang | H01R 13/6335 361/747 |
| 2017/0285282 | A1* | 10/2017 | Regnier | G02B 6/428 |
| 2017/0288770 | A1* | 10/2017 | Mentovich | H04B 10/503 |
| 2018/0034211 | A1* | 2/2018 | Little | H01R 13/642 |
| 2018/0212385 | A1* | 7/2018 | Little | H01R 31/065 |
| 2018/0368283 | A1* | 12/2018 | Little | H05K 7/20336 |
| 2019/0157810 | A1* | 5/2019 | Little | H01R 9/0515 |
| 2019/0394904 | A1* | 12/2019 | Lee | H05K 7/20409 |

OTHER PUBLICATIONS

Combined Search and Examination Report under Sections 17 and 18(3) for Application No. GB1816470.7 dated Mar. 29, 2019.
Tom Palkert, Mark Nowell and Scott Sommers QSFP-DD Hardware Specification for QSFP Double Density 8X Pluggable Transceiver, QSFP-DD Hardware Rev 3.0, Sep. 19, 2017, 69 Pages.
Proline Cisco QSFP-100G-SR4-S Compatible QSFP28 TAA Compliant Transceiver [Accessed Online] https://www.cdw.com/product/proline-cisco-qsfp.
U.S. Appl. No. 15/154,589 "Sleeve on High Temperature Plugable Optics to Avoid Burning at Skin Contact," Filed on Oct. 8, 2018.
Intellectual Property Office, Examination Report for Application GB1816470.7, dated Mar. 31, 2021.

* cited by examiner

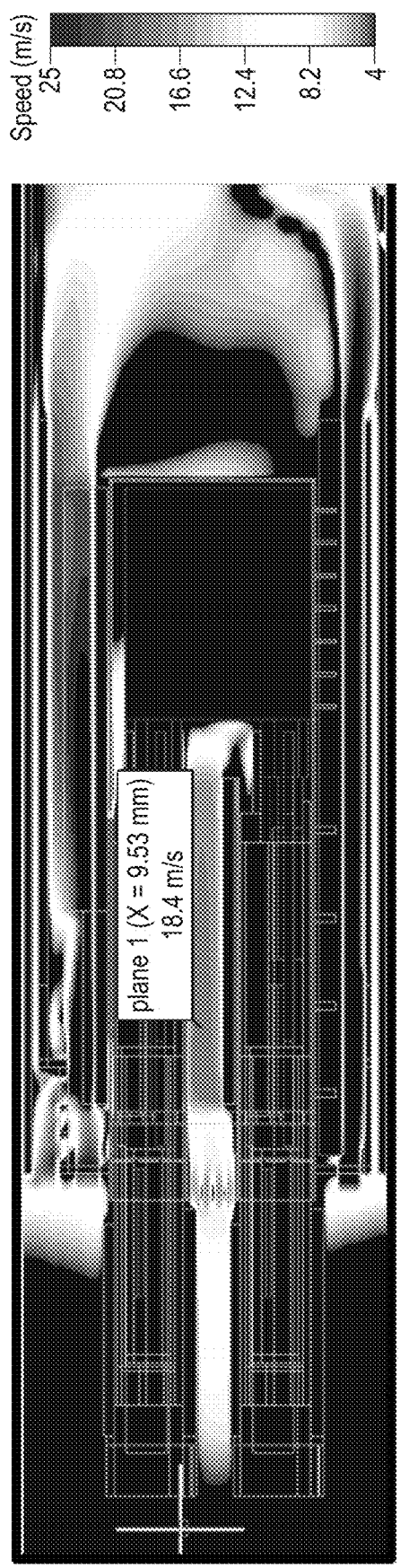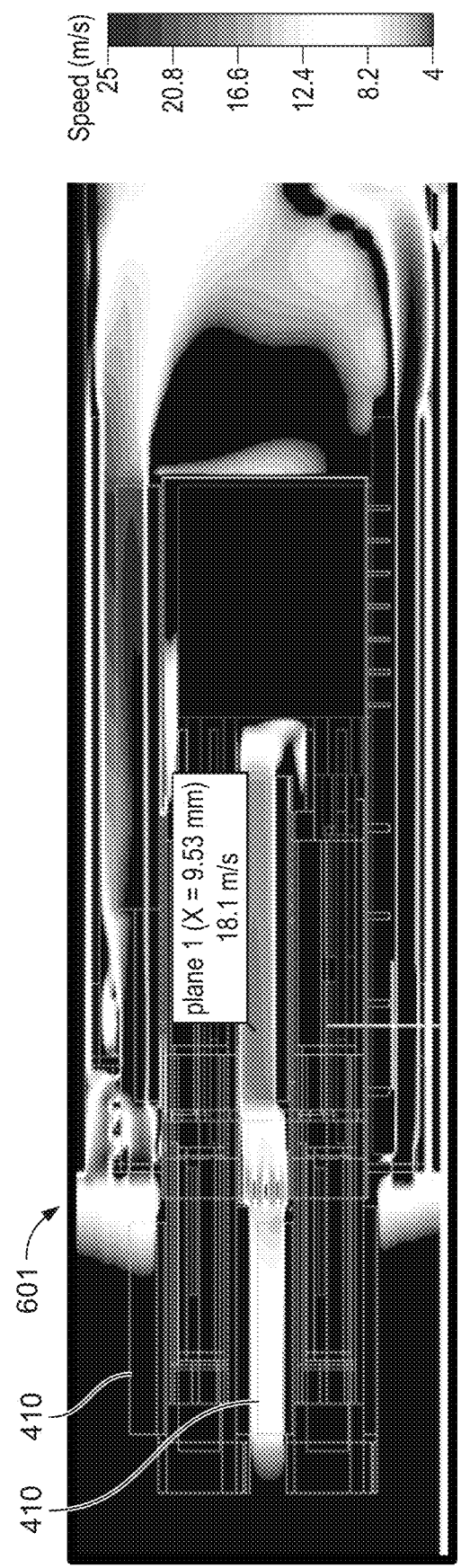
FIG. 10A
FIG. 10B

NETWORK CABINET MODULE

FIELD

The present disclosure relates generally to a pluggable module for insertion into a socket of a network cabinet, and methods of providing such a module.

BACKGROUND

Network cabinets (by way of non-limiting example, network cabinets comprising a QSFP-DD network cage, and other types of network cabinets arranged for receiving small form-factor modules), are arranged to receive pluggable modules into sockets, such as for example QSFP-DD network cage slots. Each pluggable module is arranged to be receivable in a respective one of said sockets, and provides networking functionality by virtue of integrated circuits housed within said module, at least one electrical and/or optical connector arranged to contact one or more corresponding electrical or optical connectors in the respective socket into which they may be inserted, and at least one optical and/or electrical connector arranged (typically at an opposite end of the module) for connecting with one or more network cables and/or fibres.

Such pluggable modules receive electrical power via one of their connectors, and during operation a portion of that power is dissipated as heat, which is removed from each module in order to maintain the temperature of the module and of its interior components within bounds that are acceptable for safety and reliability. To that end, a network cabinet is typically provided with an air circulation system for causing air or other cooling fluid to pass over the modules while they are operating in the cabinet.

BRIEF DESCRIPTION OF THE DRAWINGS

In order that the disclosure may be understood, specific examples are described below, with reference to the Figures in which like features are provided with like reference numerals. Figures are not necessarily drawn to scale.

FIG. 10a is an air flow map, with intensity corresponding to relative air flow speeds throughout the example QSFP-DD network cage as shown in FIG. 6 when conventional QSFP-DD modules are installed.

FIG. 10b is an air flow map, with intensity corresponding to relative air flow speeds throughout the example QSFP-DD network cage as shown in FIG. 6 when QSFP-DD modules, according to a disclosed example having a single heat sink on an upper surface of a protruding portion, are installed.

DESCRIPTION OF EXAMPLE EMBODIMENTS

Overview

Figure 1:
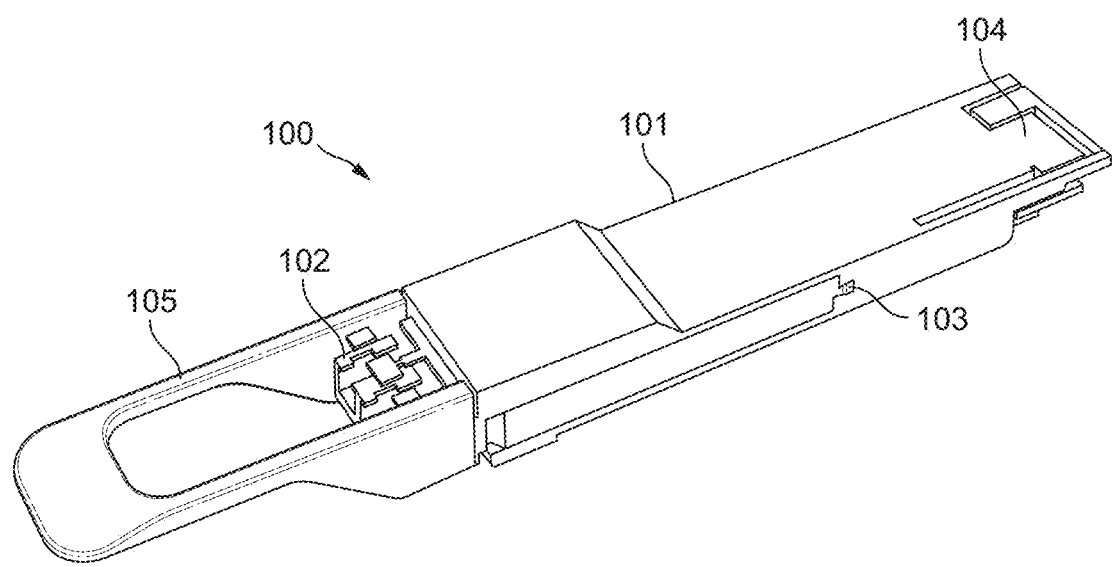
FIG. 1 is a representation of a pluggable network module, in this example a QSFP-DD module.

It has been noted that some network cabinets incorporate features such as a spring-loaded thermally conductive finger in each socket which contacts a surface of a respective module when inserted in said socket, arranged to draw heat away from the module towards a heat sink of the network cabinet, which heat sink is located in the cabinet such that cooling air flows over and/or through the heat sink. However, it has been realized that said conductive finger generally only contacts that portion of a pluggable module that is inserted into said socket. Additionally, it has been realized that in many pluggable modules, components with relatively high power dissipation such as an optical transceiver IC or other optical components, which account for a significant portion of the module's power dissipation, are physically located towards an end of the module that is close to an interconnect (e.g. electrical cable or optical fibre) connector, and that this end of the module is typically located distal from the portion which in use is inserted in the cabinet socket. Thus, it has been realized that cooling arrangements for said high power components have not previously been satisfactory. It has also been realized by the inventors that a portion of exterior module surface exists on certain pluggable modules, which portion extends outside the cabinet socket in use when the module is in a state of insertion in said cabinet socket, which portion is currently unused and which overlays or is at least adjacent to said high power components.

In the light of the above realisation, it has been proposed that a heat sink and/or heat sinking feature can be provided on the otherwise unused portion of exterior module surface, which portion protrudes from a cabinet socket when such a pluggable module is in a state of insertion in said cabinet socket. In particular, when a first portion of a module is arranged for reception in a cabinet socket such that a second portion of the module protrudes from the socket, a heat sink can be provided on a surface of the second portion. Said heat sink assists with removal of heat from the module, thereby lowering the temperature of module components, such as optical transceiver circuits which may be located adjacent to or in the second portion. This allows higher power dissipation by the module components, particularly those components situated close to (and likely involved with) the connector(s) for receiving interconnects, and/or a reduction in surface and module interior temperatures, with corresponding safety, reliability and performance improvements. It has also been realized that provision of said heat sinking features on said second portion can interfere with air flow through a network cage, e.g. by creating turbulence, thereby at least partially negating gains in cooling at the second portion by losses of cooling at the first portion. A heat sinking structure that is designed to avoid such problems has thus been provided. A heat sink means any feature arranged to improve thermal coupling between a portion of the module and a fluid circulating within a network cabinet, said fluid being, for example, air.

In a first example there is provided a pluggable module for insertion into a socket of a network cabinet, the module comprising a body having first and second portions arranged successively along an axis, wherein the module is arranged for insertion of the first portion into said socket in a direction of insertion along the axis, whereupon the second portion protrudes from said socket along the axis and away from the direction of insertion, wherein the second portion comprises a first heat sink on a first surface of the second portion, and wherein the first heat sink comprises a plurality of parallel fins aligned with the axis.

Example Embodiments

FIG. 1 shows an existing pluggable module 100 for performing networking functions in a network cabinet. As shown, the module has a body 101, with a first connector 104 for connecting electrical and/or optical signals to a backplane of the network cabinet, and a second connector 102 for connecting electrical and/or optical signals to one or more interconnects (such as electrical cables and/or optical fibres). A handle 105 is optionally also provided to aid user insertion/removal of the pluggable module 100 into/from a corresponding network cabinet socket, and latches 103 are optionally provided cooperating with the handle 105 such that the latches retain the module in the socket except when force is applied to the handle 105 in a direction of removal. By way of example, a QSFP-DD module according to the Quad Small Form-factor Pluggable (QSFP) specification is shown, although similar features exist on other small form-factor pluggable network modules such as for example those according to the QSFP, QSFP+, QSFP28, microQSFP, CXP, CFP, SFP-DD standards. Thus, the present disclosure, including the described problems and solutions, is not limited to only QSFP-DD modules but instead is applicable to any small form-factor pluggable module having similar features (e.g. a small form factor) which result in similar problems (e.g. difficulty in cooling when a limited surface area is available for providing cooling capability).

Figure 2:
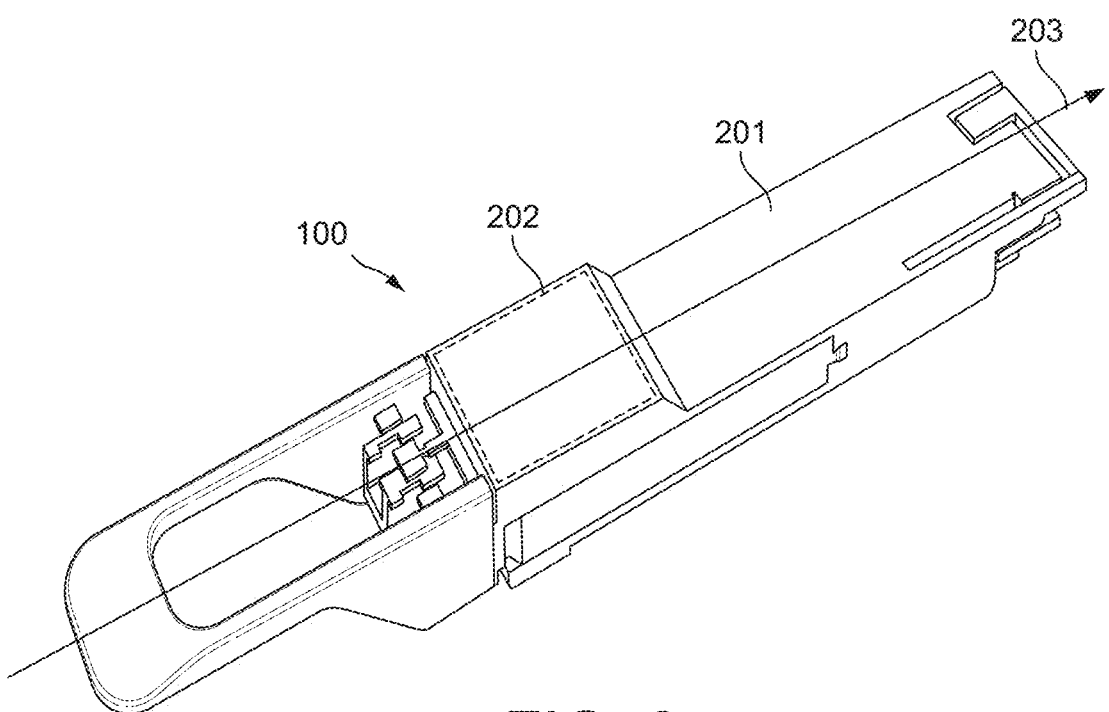
FIG. 2 shows the pluggable network module of FIG. 1, with a portion of the module highlighted which it has been realized can be used for additional cooling.

Shown in FIG. 2 is a similar pluggable network module 100, wherein a first portion 201 and a second portion 202 are arranged along an axis 203 of the body 101, that is to say that the body 101 is divided into successive, adjacent first and second portions 201, 202. The module is arranged such that in use, when inserted into a corresponding socket of a network cabinet (insertion/removal being in the direction of the axis 203), the first portion 201 is housed within the socket of the network cabinet, while the second portion 202 protrudes from the socket, i.e. the second portion projects out of the socket into an interior space of the cabinet allocated for interconnects. The cabinet (not shown) may optionally comprise features such as a thermally conductive finger within each socket, which finger contacts and thermally communicates with a surface of the first portion 201 so as to conduct heat away from the first portion 201.

As has been realized by the inventors, the second portion 202, which typically houses components (often relatively high-power components such as electrical and/or optical transceiver circuits and/or ICs) related to the nearby second connector 102, has thus far been overlooked for providing any kind of additional cooling function. Furthermore, since the optical components in the second portion 202 typically operate at high speed and therefore dissipate a significant portion of the module's power consumption, it would be especially advantageous to add heat sinking ability to the second portion 202. In addition, it will be noted that without heat sinking features on the second portion 202, much of the heat dissipated in the second portion must travel along the body 101 to the first portion 201 before it can be transferred to heat sinking features in the network cabinet (such as thermally conductive fingers inside the socket which contact the first portion 201) or to the cabinet backplane via the first connector 104.

Figure 3A:
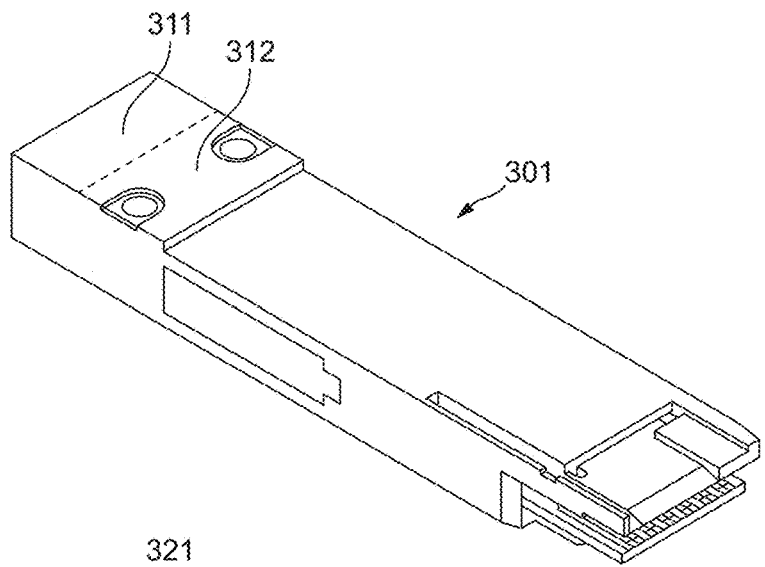
FIG. 3a shows a QSFP-DD type 1 module, with portions highlighted showing where connectors are placed and where additional heat sinking can be provided.

In a specific example of a pluggable network module 100, FIG. 3a shows a QSFP-DD type-1 module 301 having a second portion 202 which can optionally be subdivided along the axis of insertion 203 into: a connector portion 311 occupied by one or more connectors; and a case portion 312 which it has been realized is available for the addition of cooling features such as a heat sink (e.g. a heat sink can be mounted on the connector portion 312, and optionally also over the portion 311 provided that feature(s) of the connectors do not preclude that). Such a module, according to the QSFP-DD specification, has a width of about 18.35 mm, a first portion 201 length of about 58.26 mm, and a second portion 202 length of about 20 mm.

Figure 3B:
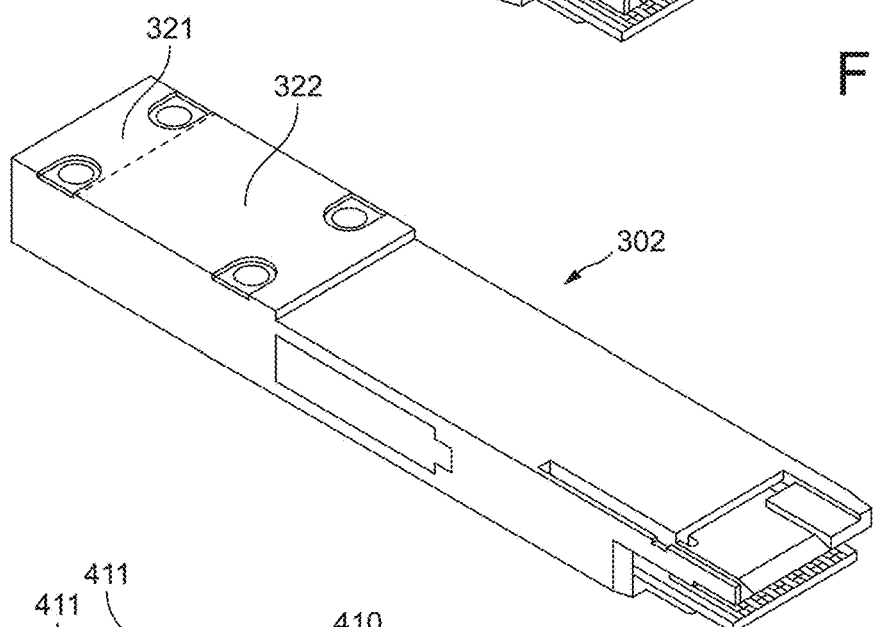
FIG. 3b shows a QSFP-DD type 2 module, with portions highlighted showing where connectors are placed and where additional heat sinking can be provided.

FIG. 3b similarly shows a QSFP-DD type-2 module 302, with a similar second portion 202 which is subdivided into: a connector portion 321 occupied by one or more connectors; and a case portion 322 which it has been realized is available for the addition of cooling features, such as a mountable heat sink and/or cooling fins/pins/undulations providing increased surface area (e.g. a heat sink can be mounted on the portion 322, and optionally also over the connector portion 321 provided that feature(s) of the connectors do not preclude that). Such a module, according to the QSFP-DD specification, has a width of about 18.35 mm, a first portion 201 length of about 58.26 mm, and a second portion 202 length of about 35 mm.

It will be noted that although the case portion 322 is permitted to be larger than the case portion 312 (by virtue of the additional length of the second portion 202 of a type-2 module 301 compared to the length of the second portion 202 of a type-1 module 100), and therefore a cooling feature (e.g. heat sink) with a larger footprint can be added to the type-2 module 302, nevertheless that does not diminish to zero the benefit of adding a cooling feature to the second portion 202, for example to the portion 312, of the type-1 module 301. Instead, a significant benefit results from the addition of a cooling feature to either the second portion 202 of a type-1 module 301 or to the second portion 202 of a type-2 module 302.

Figure 4:
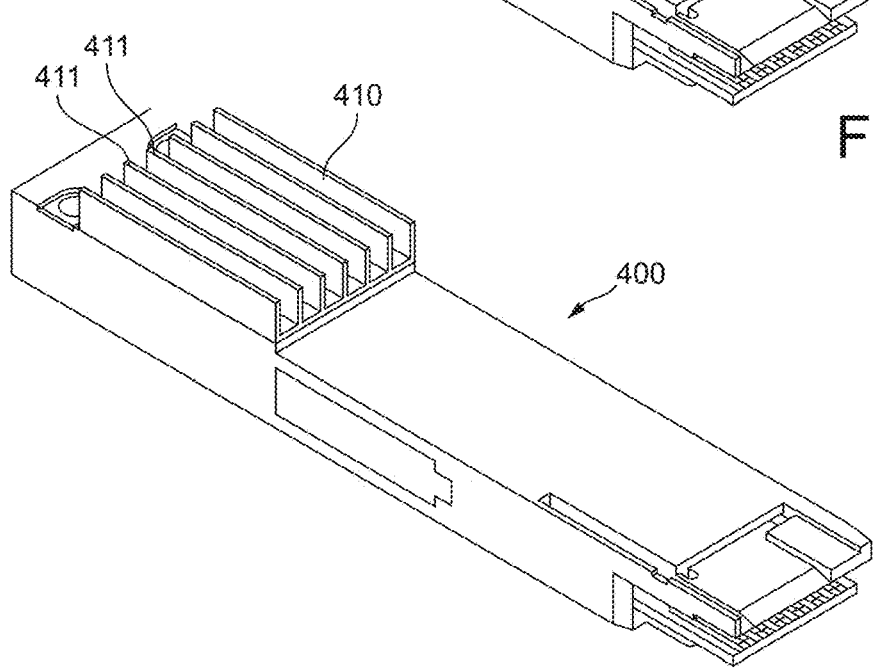
FIG. 4 shows a pluggable network module according to the disclosure, with a heat sink provided at a portion which it has been realized can be used for additional heat sinking, in this example the module being a QSFP-DD type 2 module.

FIG. 4 shows an example wherein the second portion 202 of a pluggable module 400 (similar to the module 100 shown and described with respect to the earlier Figures) further comprises a heat sink 410 on a first surface of the second portion 202. A heat sink 410 is intended to refer to any feature which is arranged to improve thermal coupling between the second portion 202 and a fluid such as air circulating within a network cabinet housing the module 400. The heat sink 410 can be formed integrally with the second portion 202 (such as for example by stamping, extrusion, additive manufacturing or by machining). Alternatively, the heat sink 410 can be a separate component that is mounted on the second portion 202, either during manufacture of a module 400, or in an act of retrofitting a heat sink 410 to an existing module 100 such as that shown and described with reference to FIG. 1, for example by suitable fixing means such as one or more fasteners, adhesive, welding or other means understood by a skilled person. A distinct heat sink mounted with fasteners such as clips or a screw can be flexibly mounted on virtually any module build according to module specifications, whereas an integrally formed heat sink consumes less space and has a better thermal interface.

As shown, the body 101 has a width perpendicular to the axis 203 and in a plane of the second portion 202, the first portion 201 has a first length along the axis 203, and the second portion 202 has a second length along the axis 203. The heat sink 410 covers an area of the second portion 202 that is substantially defined by the product of the width and at least a portion of the second length (optionally, as shown in FIGS. 3a to 4, the heat sink 410 can cover substantially the whole of the second portion 202, or can leave the connector portion 311, 321 uncovered so as to provide for operation of connector features such as a cable latch which may require the connector portion 311, 321 to be uncovered. By way of example, the QSFP-DD standard defines that QSFP-DD modules have a portion with a flat surface that protrudes from a corresponding network cage with respect to a front plate of such a network cage when the module is in the inserted state, which portion can be considered to be the above-described second portion 202.

As shown in FIG. 4, the heat sink 410 has a plurality of fins 411. In an example embodiment, the plurality of fins 411 comprise a plurality of parallel fins 411 which are aligned parallel to the axis of insertion. The heat sink 410, and its fins 411, extend outwardly from the axis 203, in a direction substantially normal to the axis 203, and/or substantially normal to the plane of the first surface of the second portion 202. It has been found that parallel fins 411 of this form, especially continuous parallel fins, (e.g. as opposed to a grid of pins extending from the surface) avoid imparting turbulence to the air flow, when a network cage provides air flow generally in a direction parallel to the axis 203 of insertion. Thereby, said parallel fins avoid slowing air flow through the network cage, and so in turn avoid reducing cooling at the first portion 201. Additionally, it is noted that parallel fins present a greater surface area to air flowing between said fins, compared to a grid of pins wherein even if a row of pins is aligned in a row that is parallel to an axis of insertion there exist areas of "dead" air between each pin which contribute little to cooling. Furthermore, in certain disclosed examples, each gap between two adjacent fins 411 can be made smaller than a diameter of a cable or fibre intended for use with the module 400, such that the cable or fibre is not able to become trapped between fins, and parallel fins are less likely to inflict damage to cables or fibres than a grid of pins, due to reduced point-loadings where cables and/or fibres contact the heat sink fins e.g. compared to point-loadings at the tips of pins.

As shown in FIGS. 5a-5f, the second portion 202 can optionally comprise a second heat sink 510 on a second surface of the second portion 202. The second surface is optionally opposite to the first surface, i.e. on an opposing side of the module 400 in a direction normal to the axis 203, but the second surface can optionally be on any other surface with respect to the first surface (for example, if the first surface is a top of the module, the second surface can optionally be a bottom surface or a side surface). Said second heat sink 510 can be present in addition to or in place of the first heat sink 410 described above. Optionally, the first and/or second surface can comprise a circular surface forming a whole or part of a cylinder around the axis of insertion 203.

Optionally, in a QSFP-DD implementation or in other disclosed examples having similar module-to-module spacing requirements, the distance that the second heat sink 510 extends normal to the axis 203 and to the plane of the second surface, can be reduced compared to the distance that the first heat sink 410 extends normal to the axis 203 and to the plane of the first surface. This reduction tends to reduce the overall surface area and thus the heat sinking capability of the second heat sink 510 as compared to that of the first heat sink 410, however, the second heat sink 510 can make up for this to at least some extent by extending further towards the end of the module 400 at the second portion 202, for example by the second heat sink 510 extending into the connector portion 311, 321, underneath the one or more second connectors 102 at the second portion 202 of the module 100.

Figure 5A:
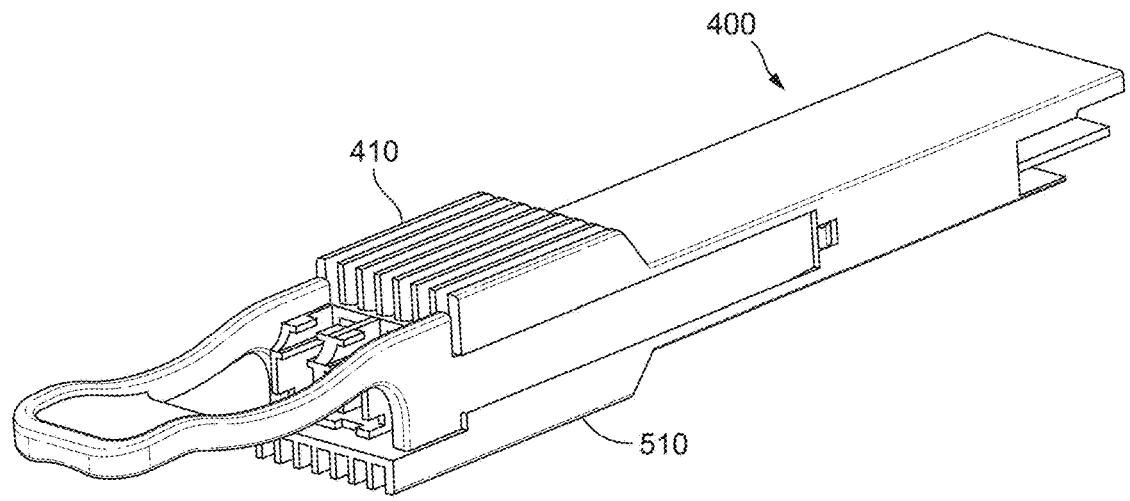
FIGS. 5a-5c are perspective views of a pluggable network module according to the disclosure, with a first heat sink provided on a first surface of a portion which it has been realized can be used for additional heat sinking, and a second heat sink provided on a second surface of said portion.
Figure 5B:
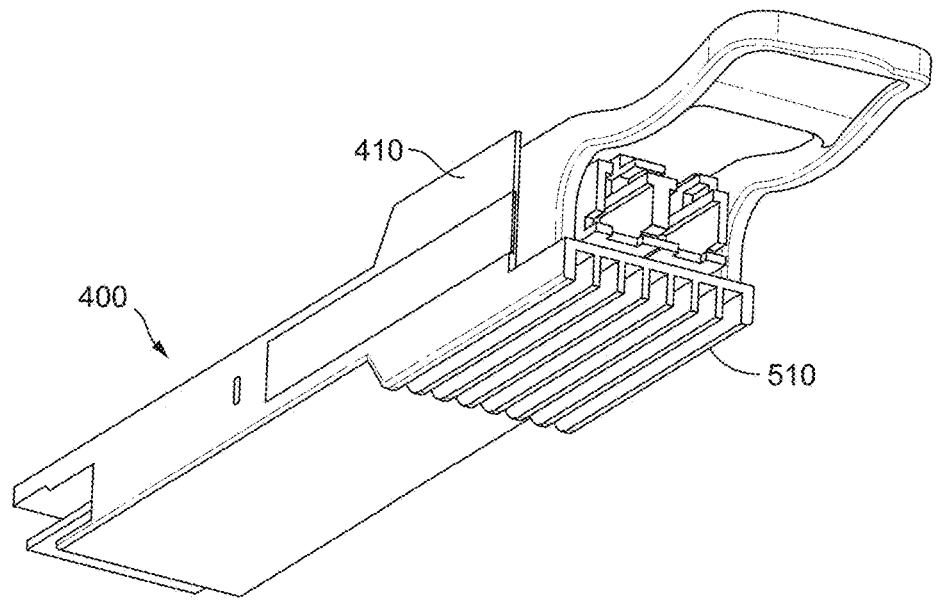
Figure 5C:
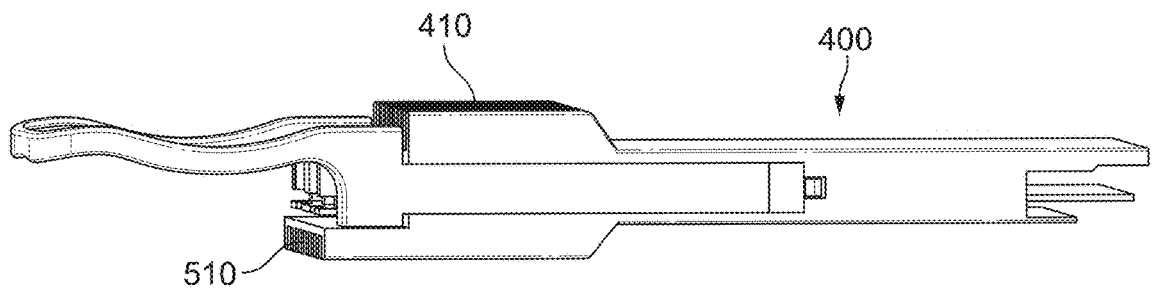
Figure 5D:
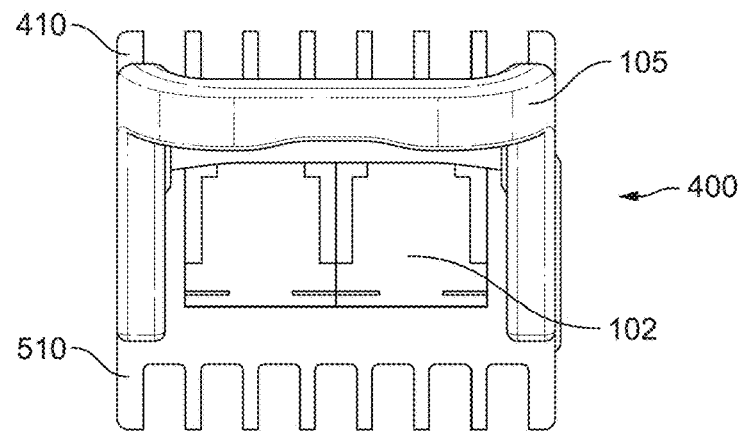
FIG. 5d is an end view of a pluggable network module according to the disclosure, showing a profile of the first heat sink and the optional second heat sink.
Figure 5E:
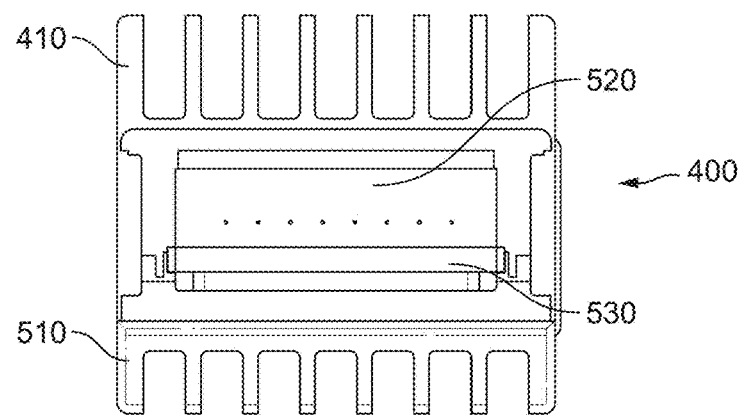
FIG. 5e is a view of a cross-section through the portion at which the heat sink(s) are provided on a pluggable module of the disclosure, showing an optional smoothed profile of the heat sink(s).
Figure 5F:
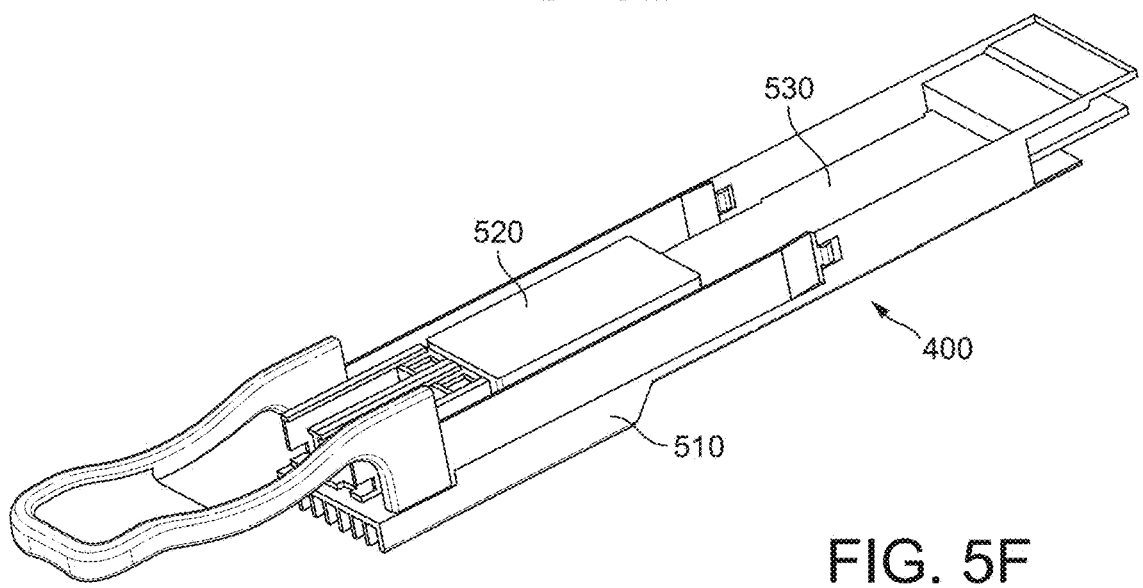
FIG. 5f is a view showing the interior of a module according to the disclosure, and showing the position of high power (e.g. optical and/or electrical transceiver ICs) adjacent to one or more interconnect (e.g. cable/fibre) connectors.

As shown in FIGS. 5e and 5f, the first 410 and the optional second 510 heat sinks are disposed on the first (and optionally the second) surface(s) of the second portion, in proximity to and/or covering the internal components of the module 400, particularly the high power components (such as optical components 520, transmitter, receiver, and/or transceiver circuits, and other integrated circuits associated with the one or more second connectors 102) which are comprised in the second portion 202. In the examples shown, for maximum heat dissipation, each of the first and second heat sinks covers a footprint area substantially equal to that defined by the product of: the width of the body 101 normal to the axis 203 at the second portion 202, and at least a portion of the length of the second portion along the axis 203.

In the examples shown in FIGS. 5e and 5f, the optical components 520 are mounted on printed circuit board 530, and the first heat sink is thermally coupled to the body 101, which is then thermally coupled to the optical components 520. Similarly, the second heat sink 510 (if included) is also thermally coupled to the body 101, which is thermally coupled to the printed circuit board 530. Of course, the components internal to the module 400 can be arranged in any suitable way, in which case the first and optionally second heat sinks 410, 510 are suitably arranged in thermal communication with the internal components.

Figure 6:
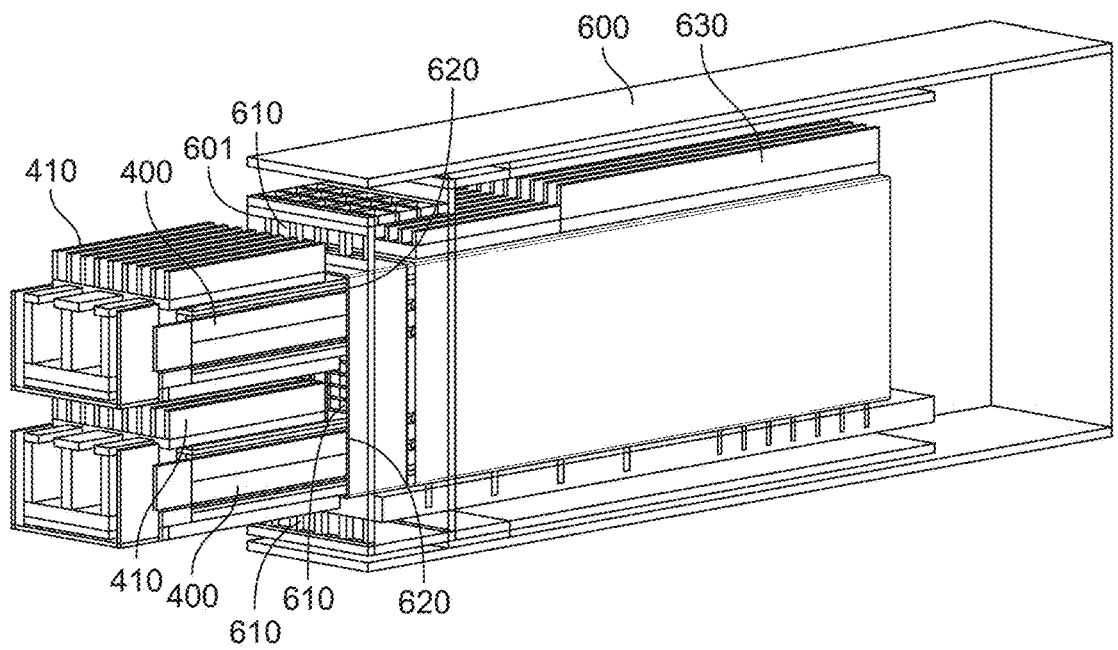
FIG. 6 is an illustration of a QSFP-DD network cage, in which multiple QSFP-DD modules can be installed with a common orientation, and showing two installed QSFP-DD modules according to a single-heat-sink example of the disclosure.

As shown in FIG. 6, two or more modules 400 can in inserted into sockets 620 of a network cage 600, with the modules 400 oriented in the same way, such that a heat sink 410 of a second module 400 inserted below a first module 400 occupies space that would otherwise be unused between the two modules shown. Multiple such network cages 600 can be mounted in a network cabinet. In such an example network cage, cooling air is actively circulated horizontally in use (e.g. by cooling fans provided in the network cabinet or in each network cage) e.g. from the left of the illustration (corresponding to the "front" of the network cabinet where network cables are plugged into the modules 400) to the right of the illustration (corresponding to the "rear" of the network cabinet, where the modules plug into a backplane that carries power and data connections to and from the modules 400). Thus, the cooling air passes over the parallel fins 411 of the heat sinks 410, without significant turbulence being introduced, through openings 610 in the network cage face plate 601, through fins of heatsinks 630 internal to the network cage (which cool thermally conductive fingers in contact with the first portions 201 of the modules 400), and towards the back of the cabinet where the air (having gained heat) is exhausted or cooled for re-use. It is noted that the external heatsink 410 can be arranged with a more efficient thermal interface between it and the module 100, compared to the internal heatsink 630, since the internal heatsink can only contact the module (e.g. via thermally conductive fingers) using light pressure in order to allow the module to be slid in and out of the network cage slot 620.

Figure 7:
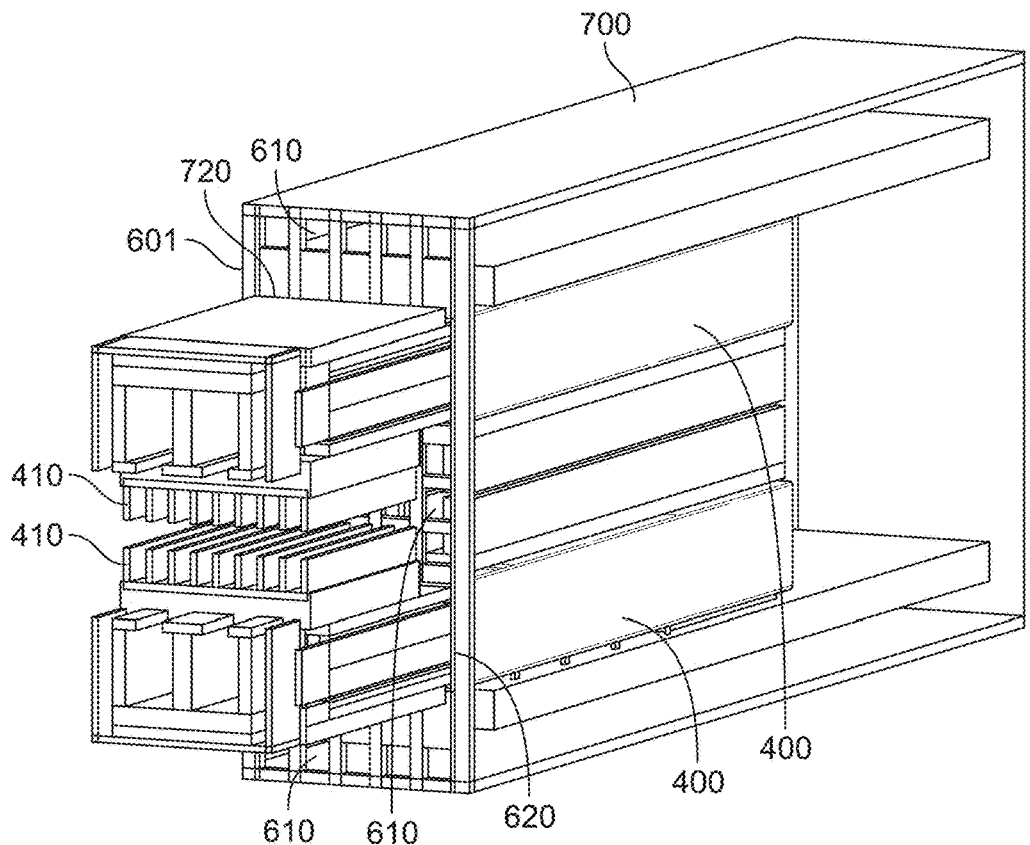
FIG. 7 is an illustration of a QSFP-DD network cage, in which multiple QSFP-DD modules can be installed with orientations 180 degrees apart rotated about an axis of insertion, and showing two installed QSFP-DD modules according to a single-heat-sink example of the disclosure.

FIG. 7 shows an alternative arrangement where a network cage 700 comprises sockets 720 arranged for insertion of modules 400 in opposing orientations (e.g. the modules 400 are oriented 180 degrees apart from each other, around the axis of insertion 203), such that a first heat sink 401 of a first module 400 faces a second heat sink 410 of a second module 400. As will be appreciated, various module packing arrangements can be used in a network cabinet, and the distance by which the heat sinks 410, 510 extend from first and/or second surfaces of the second portion 202 of the modules 400 can be adjusted so as to make best use of the space between modules while preventing clashes between modules 400 and their heat sinks 410, 510.

Figure 8A:
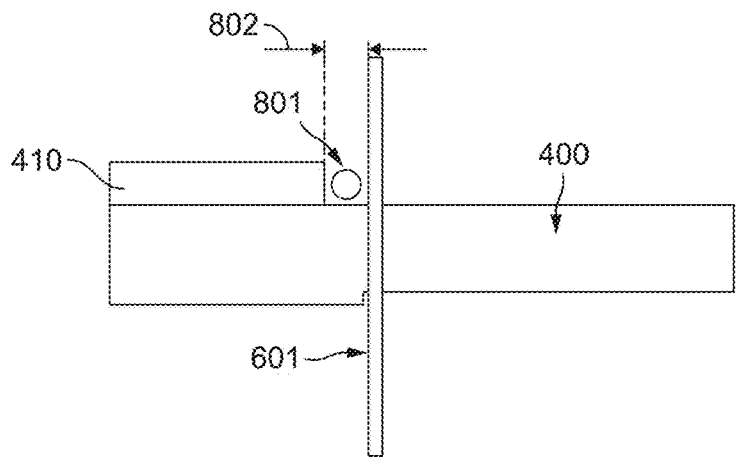
FIG. 8a is a side-view of a pluggable module according to the disclosure, showing a heat sink on a first surface of a protruding portion, and illustrating a potential trap hazard for a cable or optical fibre.
Figure 8B:
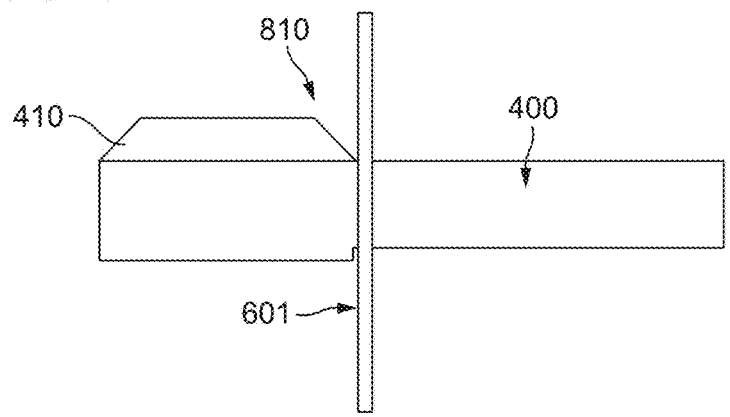
FIG. 8b is a side-view of a pluggable module according to a further disclosed example, showing a heat sink on a first surface of a protruding portion, and illustrating a chamfer feature on an edge of the heat sink, which edge coincides with a boundary between a protruding portion and an insertable portion of the module, for avoiding said potential trap hazard.

As shown in FIG. 8a, in disclosed examples where the first or second heat sink 410, 510 have straight sides, it could undesirably be possible for a cable or fibre 801 to become trapped in a gap 802 between the heat sink 410, 510 and a face plate 601 of a network cabinet or cage. In order to prevent this possibility, the heatsink can be arranged to terminate a distance from a front plate 601 of a network cage 600. Alternatively or in addition, as shown in FIGS. 5a-5c and FIG. 8b, in optional disclosed examples the first and/or second heat sinks 410, 510 can optionally be provided with a chamfer 810 at a boundary between the first and second portions 201, 202, such that the distance, by which the respective heat sinks 410, 510 extend in the direction normal to the axis 203 and planes of the first and second surfaces of the second portion 202, is reduced from a first distance (e.g. whatever is the maximum extension distance) to a second distance at the boundary between first 201 and second portions 202, wherein the second distance is less than the first distance. This chamfer 810 assists ejection of a cable or fibre 801 from between the respective heat sinks 410, 610 and a face plate 601 of the network cabinet or cage 600 when the module 400 is inserted into a socket of the network cabinet, thereby enabling said heat sink to be taller without a risk of trapping cables/fibres. Said chamfer also further reduces air flow turbulence as cooling air passes over the edges of the fins 411.

Figure 9A:
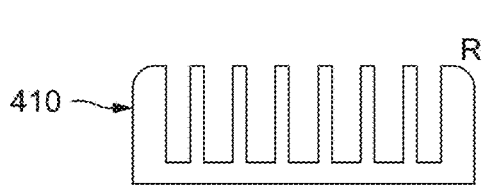
FIG. 9a shows a cross-section through the heatsink of a disclosed example, wherein the heat sink has rounded edges for preventing user injury and/or trapping of cables/fibres.
Figure 9B:
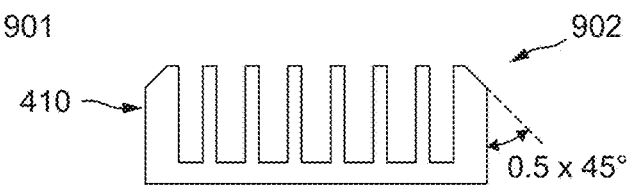
FIG. 9b shows a cross-section through the heatsink of a disclosed example, wherein the heat sink has chamfered edges for preventing user injury and/or trapping of cables/fibres.
Figure 9C:
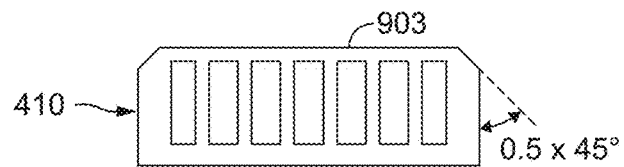
FIG. 9c shows a cross-section through the heatsink of a disclosed example, wherein the heat sink has a closed outermost (e.g. radially distal from the axis of insertion) surface, e.g. an upper surface, for preventing fibres or cables from becoming trapped between heatsink fins.

As shown in FIG. 9a, either or both of the first and second heat sinks 410, 510 can be provided with smoothed edges, especially the edges formed by the outermost fins 411. This smoothing can be in the form of a bevelled or rounded edge 901 as shown in FIG. 9a. Alternatively, as shown in FIG. 9b, a chamfered edge 902 can be employed. In the cases where the thickness of each fin 411 is small, the outermost fins can be arranged to be thicker so as to not present a sharp edge to an operator or to a cable/fibre. Such smoothing/chamfering helps a user to grip the module 400, by reducing the risk of damage to an operator's hands when gripping the modules 400 for inserting or removing or removing them. Such smoothing/chamfering also reduces the risk of damage to electrical and/or optical cables/fibres from sharp edges on the heat sinks 410. Smoothing of the ends of fins 411 can also be employed to further reduce air flow turbulence. The handle/grip 105 attached to the body 101 adjacent to the second portion 202 can also optionally be arranged so as to prevent, or reduce the likelihood of, a user's hands contacting the heat sinks 410, 510, which may allow higher heat sink surface temperatures to be safely used. Overall, however, by providing heat sink features on a module 400, even if touchable surface area is increased, surface temperature for any given power dissipation is decreased (and can optionally be designed to be below a critical touch temperature), leading to a reduced risk of operator injury. A sleeve and/or surface features such as bumps can be additionally used to further reduce risk to an operator.

As previously mentioned, the distance between fins 411 is optionally smaller than the diameter of the cables/fibres to be used with the cabinet (e.g. a fin spacing of 1.5 mm prevents 2 mm fibres or cables from becoming trapped), but in other disclosed examples (e.g. in cases where very thin fibres would require too small a spacing between fins) the heat sinks 410 can optionally be arranged with a closed outer surface 903 such that cables/fibres are prevented from being trapped between fins 411, said outer surface being for example that surface of the heat sink 410 which is distal from the body 101 in a direction that is normal to the axis 203.

Taken together, the disclosed features allow more power to be dissipated by the module's internal components, while keeping the module and its components within temperature limits (both at the module/heatsink surfaces, and at the semiconductor junctions of the internal components), and without compromising the cooling already provided at the first portion of the modules which in use is positioned inside a network cage. Thus, the disclosed features lead to enhanced safety and reliability, while permitting the use of higher-performance components when such components dissipate more heat. Furthermore, the higher acceptable module power dissipation enabled by the described features, makes modules feasible which otherwise would not be, especially in the context of 400 Gbit/second speeds and above where power targets are difficult to achieve. Thus, greater flexibility results, which may for example reduce module cost by allowing the use of lower grade components, and/or a number of ports per module may be permitted to be increased, and/or systems could be qualified for higher ambient temperatures thereby reducing cooling costs and energy consumption.

As mentioned with respect to the feature of parallel fins 411 aligned with the axis 203 of insertion, FIGS. 10*a* and 10*b* show the impact of adding such heat sinks 410 with parallel fins 411 to the second portion 202 of two modules 100, 400 stacked as shown in FIG. 6. FIG. 10*a* shows two existing modules 100 inserted into sockets 620 of a network cage 600 as shown in FIG. 6, and shows relative air flow velocities in and around the cage 600. FIG. 10*b* similarly shows two example disclosed modules 400, inserted into a network cage 600 as shown in FIG. 6. Clearly, the addition of the heat sinks 410 with parallel fins 411, on the second portion 202 close to the openings 610, has a negligible effect on air flow velocity and thus does not degrade cooling of the first portion 201.

It has been found experimentally that the addition of such heat sinks 410 on the second portion significantly reduces temperatures inside the module 400, as shown in Table 1 (scenario 1 being without a heat sink, and scenario 2 being with the heat sink 410 of disclosed examples, IC_TROSA 1:1, DSP 1:1, IC_TROSA 1:2, and DSP 1:2 being the names of components internal to the modules 100, 400, e.g.: optical components 520 such as optical transceiver IC_TROSA 1:1, IC_TROSA 1:2; and digital signal processor DSP 1:1, DSP 1:2). In the shown example, temperature of the IC_TROSA was found to drop by approximately 6 degrees Celsius, and the temperature of the DSP was found to drop by approximately 3 degrees Celsius.

TABLE 1

|  | Pro | Scenario 1 | Scenario 2 |
|---|---|---|---|
| System: Ambient | 40 . . . | 40 deg C. | 30 deg C. |
| Heat Sink: De-activate | No | Yes | No |
| IC-TROSA HEAT SOURCE: Junction Power (W) | 8 | 8 | 8 |
| DSP 1:2 Junction Power (W) | 13 | 13 | 13 |
| DC-DC: Junction Power (W) | 2.63 | 2.63 | 2.63 |
| Heat Sink: De-activate | No | Yes | No |
| Solution Status | Int . . . | Steady State Not Conver . . . | Interrupted |
| Store Results? | Full | Full | Full |
| Initialize From | N . . . | Base Project | Base Project |
| IC-TROSA 1:1: Temperature (° C.) | — | 84.88398 | 78.14717 |
| DSP 1:1: Junction 1 Temperature (° C.) | 95 . . . | 98.909 | 95.765 |
| IC-TROSA 1:2: Temperature (° C.) | — | 83.06517 | 77.6202.2 |
| DSP 1:2: Junction 1 Temperature (° C.) | 93 . . . | 96.187 | 93.787 |

Figure 11:
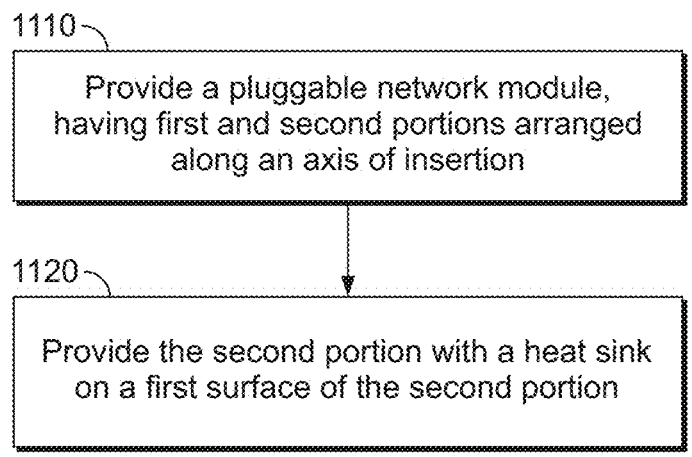
FIG. 11 relates to a method of providing a pluggable network module according to a disclosed example.

Turning to FIG. 11, a pluggable network module according to disclosed examples can be provided by: in a first step 1110, providing a pluggable module suitable for insertion into a socket of a network cabinet, wherein the module comprises a body having first and second portions arranged (e.g. successively) along an axis, and arranged such that when the first portion is inserted in a direction of the axis into said socket the second portion protrudes from said socket; and in a second step 1120, providing the second portion with a first heat sink feature on a first surface of the second portion, wherein the first heat sink comprises a plurality of parallel fins aligned with the axis of insertion.

Figure 12:
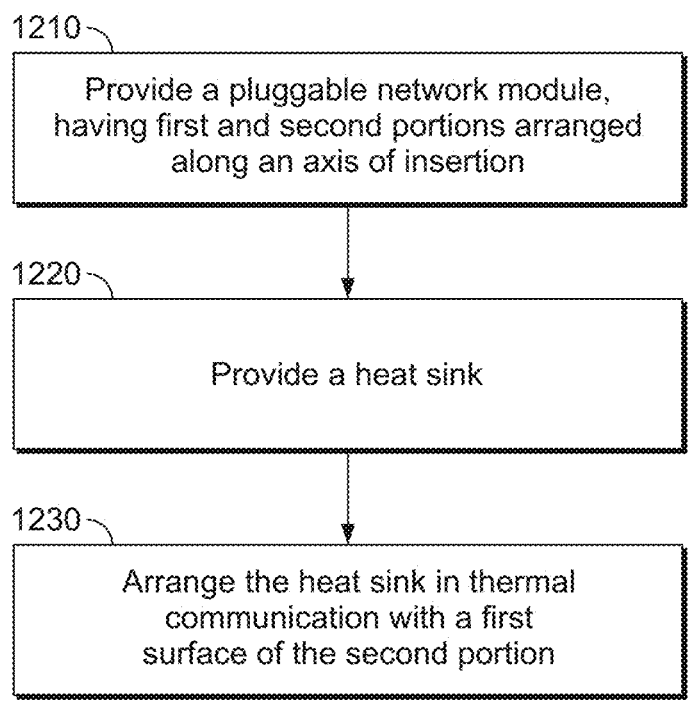
FIG. 12 relates to a method of retrofitting a heat sink to a pluggable network module.

Turning to FIG. 12, an existing pluggable network module can be retrofitted with a heat sink by: in a first step 1210, providing a pluggable module suitable for insertion into a socket of a network cabinet, wherein the module comprises a body having first and second portions arranged along an axis, and arranged such that when the first portion is inserted in a direction of the axis into said cage the second portion protrudes from said cage; in a second step 1220, providing a heat sink; and in a third step 1230, arranging the heat sink in thermal communication with a first surface of the second portion, wherein the first heat sink comprises a plurality of parallel fins aligned with the axis of insertion.

Details of the disclosed examples may be varied without departing from the scope of the invention which is defined by the appended claims. Many combinations, modifications, or alterations to the features of the disclosed examples will be readily apparent and are intended to form part of the disclosure. Any of the features described specifically relating to one example may be used in any other example by making appropriate changes as apparent in the light of the above disclosure.

It will be appreciated in the light of the present disclosure that certain features of certain examples described herein can be advantageously combined with those of other described examples. The description of specific examples should not therefore be interpreted as indicating that all of the described steps and/or features are essential. Instead, it will be understood that certain steps and/or features are optional by virtue of their function or purpose, even where those steps or features are not explicitly described as being optional. The disclosed examples are thus not intended to limit the disclosure, and instead the invention is defined by the appended claims.

In a first further example there is provided a pluggable module for insertion into a socket of a network cabinet, the pluggable module comprising a body having first and second portions arranged along an axis, wherein the module is arranged for insertion of the first portion into said socket in a direction of insertion along the axis, whereupon the second portion protrudes from said socket along the axis and away from the direction of insertion, wherein the second portion comprises a first heat sink on a first surface of the second portion, wherein the first heat sink comprises a plurality of parallel fins aligned with the axis.

Optionally, the pluggable module is a QSFP-DD module for insertion into a QSFP-DD cage of a network cabinet. Optionally, the pluggable module is a QSFP-DD type 2 module.

Optionally, the body has a width perpendicular to the axis, the first portion has a first length along the axis, the second portion has a second length along the axis, and the first heat sink covers an area of substantially the width by at least a portion of the second length.

Optionally, the second portion is a front portion when the pluggable module is in use in a socket, and wherein the first surface is one of an upper and a lower surface when the pluggable module is in use in a socket.

Optionally, the second portion comprises a second heat sink in thermal communication with a second surface. Optionally, the second surface is opposite the first surface.

Optionally, each heat sink comprises a plurality of fins, and wherein a gap between two adjacent fins is smaller than a diameter of a cable or fibre defined for use with the pluggable module.

Optionally, each heat sink extends in a direction normal to the axis, and comprises a chamfer at which the extension is reduced from a maximum distance to a reduced distance at a boundary between the first and second portions.

Optionally, each heat sink comprises an at least partially closed surface, said surface distal from the body in a direction that is normal to the axis.

Optionally, the second portion comprises one or more optical components, each optical component comprising at least one of an optical transmitter and an optical receiver. Optionally, each heat sink substantially covers at least one of the one or more optical components, and wherein the first and/or second heatsinks are thermally coupled to the at least one of the one or more optical components.

Optionally, the second portion comprises a connection for an interconnect. Optionally, the interconnect comprises at least one of an electrical cable and an optical fibre.

Optionally, each heat sink is arranged with one or more smooth edges.

Optionally, the pluggable module further comprises a grip attached to the body adjacent to the second portion. Optionally, the grip is shaped to prevent a user from contacting the heat sink.

In a second further example there is provided a method comprising: providing a pluggable module suitable for insertion into a socket of a network cabinet, wherein the pluggable module comprises a body having first and second portions arranged along an axis, and arranged such that when the first portion is inserted in a direction of insertion along the axis into said socket the second portion protrudes from said socket along the axis and away from the direction of insertion; and providing the second portion with a first heat sink on a first surface of the second portion, wherein the first heat sink comprises a plurality of parallel fins aligned with the axis.

In a third further example there is provided a method of retrofitting a heat sink to a pluggable module, the method comprising: providing a pluggable module suitable for insertion into a socket of a network cabinet, wherein the pluggable module comprises a body having first and second portions arranged along an axis, and arranged such that when the first portion is inserted in a direction of insertion along the axis into said socket the second portion protrudes from said socket along the axis and away from the direction of insertion; providing a heat sink; and arranging the heat sink in thermal communication with a first surface of the second portion wherein the heat sink comprises a plurality of parallel fins aligned with the axis.

Optionally, the pluggable module is a QSFP-DD module for insertion into a QSFP-DD cage of a network cabinet. Optionally, the pluggable module is a QSFP-DD type 2 module.

Optional features of the first further example can be combined with either of the second and third further example, as appropriate.

The invention claimed is:

1. A pluggable module for insertion into a socket of a network cabinet, the pluggable module, comprising:
a body having first and second portions arranged along an axis,
wherein the pluggable module is arranged for insertion of the first portion into the socket in a direction of insertion along the axis, whereupon the second portion protrudes from the socket along the axis and away from the direction of insertion,
wherein the second portion comprises a first heat sink on a first surface of the second portion, wherein the first heat sink comprises a plurality of parallel fins aligned with the axis, wherein the plurality of parallel fins are chamfered at a boundary between the first and second portions, and wherein the plurality of parallel fins terminate at a face plate of the network cabinet when the first portion is inserted into the socket.

2. The pluggable module of claim 1, wherein the pluggable module is a QSFP-DD module for insertion into a QSFP-DD cage of the network cabinet.

3. The pluggable module of claim 2, wherein the pluggable module is a QSFP-DD type 2 module.

4. The pluggable module of claim 2, wherein the body has a width perpendicular to the axis, the first portion has a first length along the axis, the second portion has a second length along the axis, and the first heat sink covers an area of substantially the width by at least a portion of the second length.

5. The pluggable module of claim 2, wherein the second portion is a front portion when the pluggable module is in use in the socket, and wherein the first surface is one of an upper and a lower surface when the pluggable module is in use in the socket.

6. The pluggable module claim 2, wherein the second portion comprises a second heat sink in thermal communication with a second surface.

7. The pluggable module of claim 6, wherein the second surface is opposite the first surface.

8. The pluggable module of claim 6, wherein each of the first and second heat sinks comprises a plurality of fins, and wherein a gap between two adjacent fins is smaller than a diameter of a cable or fibre defined for use with the pluggable module.

9. The pluggable module of claim 6, wherein each of the first and second heat sinks extends in a direction normal to the axis, and comprises a chamfer at which a height of each of the first and second heat sinks is reduced from a maximum distance to a reduced distance at a boundary between the first and second portions.

10. The pluggable module of claim 6, wherein each of the first and second heat sinks comprises an at least partially closed surface, the surface distal from the body in a direction that is normal to the axis.

11. The pluggable module of claim 6, wherein the second portion comprises one or more optical components, each optical component comprising at least one of an optical transmitter and an optical receiver.

12. The pluggable module of claim 11, wherein each of the first and second heat sinks substantially covers at least one of the one or more optical components, and wherein the first or second heat sinks are thermally coupled to the at least one of the one or more optical components.

13. The pluggable module of claim 11, wherein the second portion comprises a connection for an interconnect.

14. The pluggable module of claim 13, wherein the interconnect comprises at least one of an electrical cable and an optical fibre.

15. The pluggable module of claim 13, wherein each of the first and second heat sinks is arranged with one or more smooth edges.

16. The pluggable module of claim 13, wherein the pluggable module further comprises a grip attached to the body adjacent to the second portion.

17. The pluggable module of claim 16, wherein the grip is shaped to prevent a user from contacting the first heat sink.

18. A method comprising:
provSearchParamsiding a pluggable module suitable for insertion into a socket of a network cabinet, wherein the pluggable module comprises a body having first and second portions arranged along an axis, and arranged such that when the first portion is inserted in a direction of insertion along the axis into the socket the second portion protrudes from the socket along the axis and away from the direction of insertion; and
providing the second portion with a first heat sink on a first surface of the second portion, wherein the first heat sink comprises a plurality of parallel fins aligned with the axis, wherein the plurality of parallel fins are chamfered at a boundary between the first and second portions, and wherein the plurality of parallel fins terminate at a face plate of the network cabinet when the first portion is inserted into the socket.

19. The method of claim 18, wherein the pluggable module is a QSFP-DD module for insertion into a QSFP-DD cage of the network cabinet.

20. A method of retrofitting a heat sink to a pluggable module, the method comprising:
providing the pluggable module suitable for insertion into a socket of a network cabinet, wherein the pluggable module comprises a body having first and second portions arranged along an axis, and arranged such that when the first portion is inserted in a direction of insertion along the axis into the socket the second portion protrudes from the socket along the axis and away from the direction of insertion;
providing the heat sink; and
arranging the heat sink in thermal communication with a first surface of the second portion wherein the heat sink comprises a plurality of parallel fins aligned with the axis, wherein the plurality of parallel fins are chamfered at a boundary between the first and second portions, and wherein the plurality of parallel fins terminate at a face plate of the network cabinet when the first portion is inserted into the socket.

21. The method of claim 20, wherein the pluggable module is a QSFP-DD module for insertion into a QSFP-DD cage of the network cabinet.

22. The method of claim 20, wherein the pluggable module is a QSFP-DD type 2 module.

\* \* \* \* \*